(12) United States Patent
Hossain

(10) Patent No.: US 8,778,764 B2
(45) Date of Patent: Jul. 15, 2014

(54) METHOD OF MAKING AN INSULATED GATE SEMICONDUCTOR DEVICE HAVING A SHIELD ELECTRODE STRUCTURE AND STRUCTURE THEREFOR

(75) Inventor: Zia Hossain, Tempe, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/550,156

(22) Filed: Jul. 16, 2012

(65) Prior Publication Data

US 2014/0015039 A1 Jan. 16, 2014

(51) Int. Cl.
*H01L 21/336* (2006.01)

(52) U.S. Cl.
USPC .................... 438/270; 257/139; 257/330

(58) Field of Classification Search
USPC .................. 257/139, 330; 438/270
See application file for complete search history.

(56) References Cited

U.S. PATENT DOCUMENTS

| | | | |
|---|---|---|---|
| 5,973,360 A | 10/1999 | Tihanyi | |
| 5,998,833 A | 12/1999 | Baliga | |
| 6,365,462 B2 | 4/2002 | Baliga | |
| 7,344,943 B2 | 3/2008 | Herrick et al. | |
| 7,361,539 B2 | 4/2008 | Chen et al. | |
| 7,452,777 B2 | 11/2008 | Kocon et al. | |
| 7,485,544 B2 | 2/2009 | Forbes et al. | |
| 7,504,306 B2 | 3/2009 | Sapp et al. | |
| 7,525,162 B2 | 4/2009 | Yin et al. | |
| 7,585,720 B2 | 9/2009 | Sudo | |
| 7,741,185 B2 | 6/2010 | Tanabe | |
| 7,767,540 B2 | 8/2010 | Peidous et al. | |
| 2004/0232410 A9 | 11/2004 | Dahmani et al. | |
| 2005/0093030 A1 | 5/2005 | Doris et al. | |
| 2007/0126055 A1 | 6/2007 | Hueting et al. | |
| 2009/0014807 A1 | 1/2009 | Tang et al. | |
| 2009/0050959 A1 | 2/2009 | Madson | |
| 2009/0079011 A1 | 3/2009 | Chidambarrao et al. | |
| 2010/0171171 A1 | 7/2010 | Hsu et al. | |
| 2010/0187602 A1 | 7/2010 | Woolsey et al. | |
| 2011/0169103 A1* | 7/2011 | Darwish et al. | ............... 257/409 |
| 2012/0319199 A1* | 12/2012 | Zeng et al. | .................... 257/334 |
| 2012/0326227 A1* | 12/2012 | Burke et al. | .................. 257/330 |

OTHER PUBLICATIONS

Moens; Stress-Induced Mobility Enhancement for Integrated Power Transistors; IEEE, IEDM 2007; pp. 877-880; Dec. 2007.
Wang; Enhanced Electrical and Thermal Properties of Trench Metal-Oxide-Semiconductor Field-Effect Transistor Built on Copper Substrate; IEEE Electron Device Letters, vol. 30, No. 1, Jan. 2009.
Anonymous; Trench PowerFET with Improved Switching Performance; www.ip.com; IP.com No. IPCOM000161992D; Dec. 12, 2007.

* cited by examiner

*Primary Examiner* — David Vu
*Assistant Examiner* — Brandon Fox
(74) *Attorney, Agent, or Firm* — Kevin B. Jackson

(57) ABSTRACT

In one embodiment, a semiconductor device includes a multi-portion shield electrode structure formed in a drift region. The shield electrode includes a wide portion formed in proximity to a channel side of the drift region, and a narrow portion formed deeper in the drift region. The narrow portion is separated from the drift region by a thicker dielectric region, and the wide portion is separated from the drift region by a thinner dielectric region. That portion of the drift region in proximity to the wide portion can have a higher dopant concentration than other portions of the drift region.

11 Claims, 15 Drawing Sheets

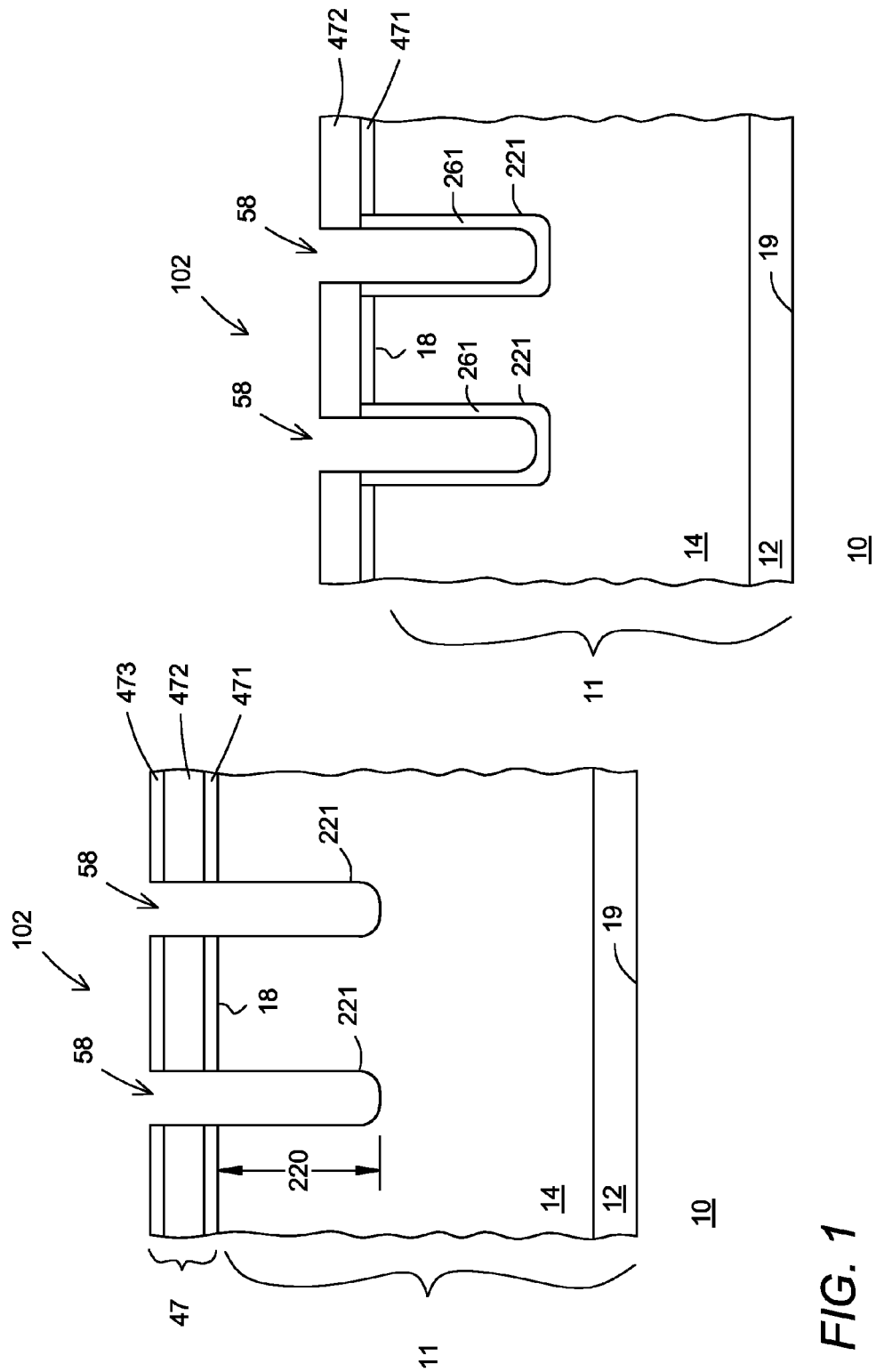

METHOD OF MAKING AN INSULATED GATE SEMICONDUCTOR DEVICE HAVING A SHIELD ELECTRODE STRUCTURE AND STRUCTURE THEREFOR

BACKGROUND OF THE INVENTION

This document relates generally to semiconductor devices and, more specifically, to methods of forming insulated gate devices and structures.

Insulated gate field effect transistors (IGFETs) such as, metal oxide semiconductor field effect transistors (MOSFETs), have been used in many power switching applications, such as dc-dc converters. In a typical MOSFET, a gate electrode provides turn-on and turn-off control with the application of an appropriate gate voltage. By way of example, in an n-type enhancement mode MOSFET, turn-on occurs when a conductive n-type inversion layer (i.e., channel region) is formed in a p-type body region in response to the application of a positive gate voltage, which exceeds an inherent threshold voltage. The inversion layer connects n-type source regions to n-type drain regions and allows for majority carrier conduction between these regions.

There is a class of MOSFET devices in which the gate electrode is formed in a trench that extends downward from a major surface of a semiconductor material, such as silicon. Current flow in this class of devices is primarily in a vertical direction through the device, and, as a result, device cells can be more densely packed. All else being equal, the more densely packed device cells can increase the current carrying capability and reduce on-resistance of the device.

Achieving reduced specific on-resistance (ohm-area) performance is one objective for MOSFET device designers. A reduced specific on-resistance can determine product cost and gross margins or profitability for a MOSFET design. For example, a low specific on-resistance allows for a smaller MOSFET die or chip, which, in turn, leads to lower costs in semiconductor materials and package structures. Various methods have been used or evaluated for reducing on-resistance. Such methods have included adding recessed field plates or shield electrodes, which has allowed the use of higher drift region dopant concentrations. However, several disadvantages have been found with devices using such recessed field plate design approaches. Such disadvantages have included, for example, higher gate-to-drain capacitance ($Q_{GD}$), which impacts switching speed, excessive ringing, lower breakdown voltages ($BV_{DSS}$), and lower figures of merit, such as unclamped inductive switching (UIS).

Accordingly, it is desirable to have a method and structure that reduces specific on-resistance, improves switching characteristics, reduces ringing, at least maintains $BV_{DSS}$ performance, and improves figures of merit, such as UIS.

BRIEF DESCRIPTION OF THE DRAWINGS

FIGS. 1-10 illustrate partial cross-sectional views of a semiconductor device at various stages of fabrication in accordance with a first embodiment of the present invention;

Figure 3:
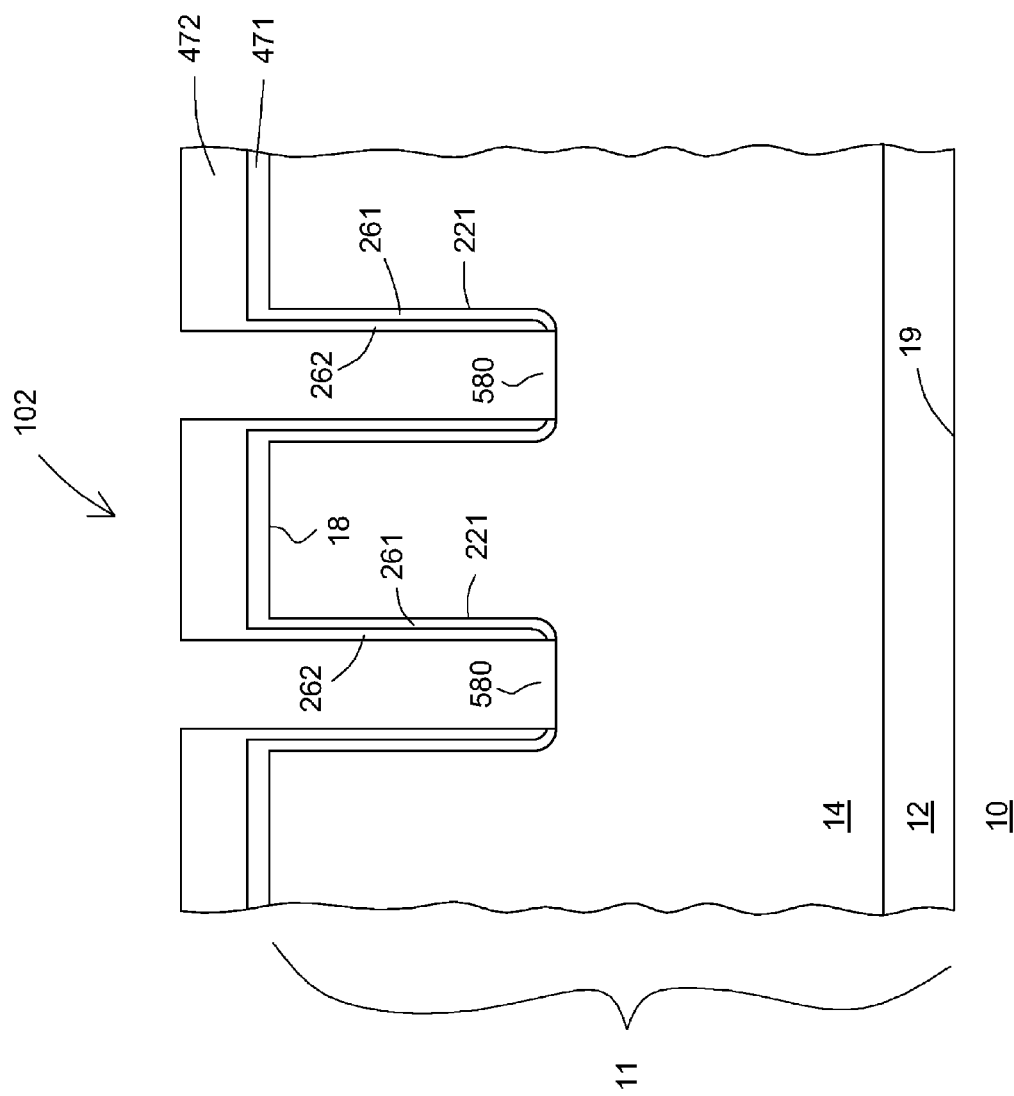

For simplicity and clarity of illustration, elements in the figures are not necessarily drawn to scale, and the same reference numbers in different figures denote generally the same elements. Additionally, descriptions and details of well-known steps and elements may be omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-channel devices, a person of ordinary skill in the art understands that P-channel devices and complementary devices are also possible in accordance with the present description. For clarity of the drawings, doped regions of device structures can be illustrated as having generally straight-line edges and precise angular corners; however, those skilled in the art understand that due to the diffusion and activation of dopants, the edges of doped regions are generally not straight lines and the corners are not precise angles.

Furthermore, the term "major surface" when used in conjunction with a semiconductor region or substrate means the surface of the semiconductor region or substrate that forms an interface with another material, such as a dielectric, an insulator, a conductor, or a polycrystalline semiconductor. The major surface can have a topography that changes in the x, y and z directions.

In addition, structures of the present description can embody either a cellular-base design (in which the body regions are a plurality of distinct and separate cellular or stripe regions) or a single-base design (in which the body region is a single region formed in an elongated pattern, typically in a serpentine pattern or a central portion with connected appendages). However, one embodiment of the present description will be described as a cellular base design throughout the description for ease of understanding. It should be understood that the present disclosure encompasses both a cellular-base design and a single-base design.

DETAILED DESCRIPTION OF THE DRAWINGS

FIG. 1 illustrates a partial cross-sectional view of a semiconductor device 10 or cell 10 at an early stage of fabrication in accordance with a first embodiment. Device 10 includes a region of semiconductor material, semiconductor substrate, or semiconductor region 11, which can include, for example, an n-type silicon substrate 12 having a resistivity ranging from about 0.001 ohm-cm to about 0.005 ohm-cm. By way of example, substrate 12 can be doped with phosphorous, arsenic, or antimony. In the embodiment illustrated, substrate 12 provides a drain region, drain contact, or a first current carrying contact for device 10. In this embodiment, device 10 can be formed in an active area 102 of a semiconductor chip. Also, in this embodiment, device 10 can be configured as a vertical power MOSFET structure, but this description applies as well to insulated gate bipolar transistors (IGBT), MOS-gated thyristors, and other related or equivalent structures as known by one of ordinary skill in the relevant art.

A semiconductor layer, drift region, or extended drain region 14 can be formed in, on, or overlying substrate 12. In one embodiment, semiconductor layer 14 can be formed using semiconductor epitaxial growth techniques. Alternatively, semiconductor layer 14 can be formed using semiconductor doping and diffusion techniques. In an embodiment suitable for a 50 volt device, semiconductor layer 14 can be n-type with a dopant concentration of about $1.0 \times 10^{16}$ atoms/$cm^3$ to about $1.0 \times 10^{17}$ atoms/$cm^3$ and can have a thickness from about 3 microns to about 5 microns. The dopant concentration and thickness of semiconductor layer 14 can be increased or decreased depending on the desired drain-to-source breakdown voltage ($BV_{DSS}$) rating of device 10. In one embodiment, semiconductor layer 14 can have graded dopant profile. In one embodiment, semiconductor layer 14 can have a dopant profile that provides a region of higher dopant concentration in proximity to where the drain ends of the channel regions of device 10 meet semiconductor layer 14. By way of example, such a configuration is illustrated as regions 330 in FIG. 8. In an alternate embodiment, the conductivity type of substrate 12 can be opposite to the conductivity type of semiconductor layer 14 to form, for example, an IGBT embodiment. Also, it is understood that other materials can be used for region of semiconductor material 11 or portions thereof including silicon-germanium, silicon-germanium-carbon, carbon-doped silicon, silicon carbide, semiconductor on insulator (SOI), or other related or equivalent materials as known by one of ordinary skill in the art.

A masking layer 47 can be formed overlying a major surface 18 of region of semiconductor material 11. Region of semiconductor material 11 can also include a major surface 19, which is opposite to major surface 18. In one embodiment, masking layer 47 can comprise a dielectric film or a film resistant to the etch chemistries used to form trench structures described hereinafter. In one embodiment, masking layer 47 can include more than one layer including, for example, a dielectric layer 471 of 0.030 microns of thermal oxide, a dielectric layer 472 of about 0.2 microns of silicon nitride, and a dielectric layer 473 of about 0.1 microns of deposited oxide.

Openings 58 can then be formed in masking layer 47. In one embodiment, photoresist and etch processes can be used to form openings 58. In one embodiment, openings 58 can have a width of about 0.2 microns to about 0.3 microns. In one embodiment, an initial spacing between openings 58 can be about 0.55 microns to about 0.65 microns.

After openings 58 are formed, segments of semiconductor layer 14 can be removed to form trenches 221 extending from major surface 18. By way of example, trenches 221 can be etched using plasma etching techniques with a fluorocarbon chemistry or a fluorinated chemistry (for example, $SF_6/O_2$). In accordance with the present embodiment, trenches 221 can form first parts or portions of trench structures, which will be designated as trench structures 22 starting in FIG. 4. In one embodiment, trenches 221 can have a depth 220 of about 0.8 microns to about 2.5 microns. In accordance with the present embodiment, trenches 221 can have a depth 220 that extends about 0.3 microns to about 0.7 microns below the depth of the body regions of device 10, which will be described later.

FIG. 2 illustrates a partial cross-sectional view of device 10 after additional processing. In an optional step, a sacrificial layer (not shown) can be formed adjoining surfaces of trenches 221. By way of example, a thermal silicon oxide layer can be formed. Next, the sacrificial layer and dielectric layer 473 can be removed using, for example, an etch process. A layer 261 of material can then be formed along surfaces of trenches 221. In one embodiment, layers 261 can be a dielectric or insulative material. By way of example, layers 261 can be about a 0.03 micron wet or thermal oxide layer. Portions of semiconductor layer 14 can be consumed during the formation of layers 261.

Figure 4:
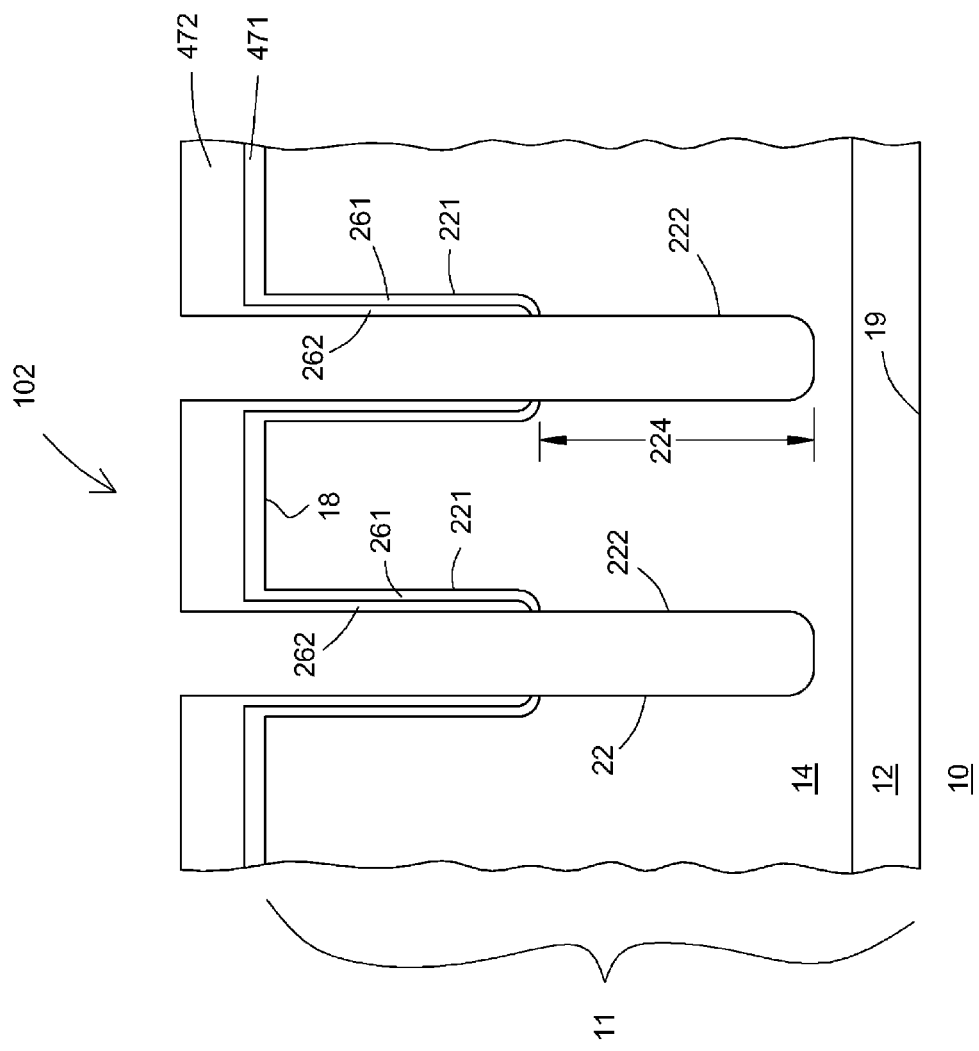

FIG. 3 illustrates a partial cross-sectional view of device 10 after further processing. A dielectric layer 262 can be formed along layer 261 and sidewalls of layers 471 and 472. In one embodiment, dielectric layer 262 can be a nitride layer, and can have a thickness of about 0.025 microns. In an alternate embodiment, a crystalline semiconductor layer, such as an undoped polysilicon layer, can be formed between layers 262 and 261. Next, an anisotropic dry etch can be used to remove portions of layers 262 and 261 from lower surfaces of trenches 221 to form openings 580, which can expose segments of semiconductor layer 14. After openings 580 are formed, segments of semiconductor layer 14 can be removed to form trenches 222 extending from trenches 221 as illustrated in FIG. 4. By way of example, trenches 222 can be etched using plasma etching techniques with a fluorocarbon chemistry or a fluorinated chemistry (for example, $SF_6/O_2$). In accordance with the present embodiment, trenches 222 can form second parts or portions of trench structures or multi-part trenches 22. In one embodiment, trenches 222 can have a depth 224 of about 0.5 microns to about 2.0 microns. In one embodiment, trench structures 22 can have a cumulative depth of about 1.3 microns to about 4.5 microns. In one embodiment, trench structures 22 can extend partially into semiconductor layer 14. In one embodiment, trench structures 22 can extend through semiconductor layer 14 and into substrate 12. In accordance with the present embodiment, trench structures 22 can be configured as gate electrode and shield electrode trenches for device 10 formed within active area 102.

Figure 5:
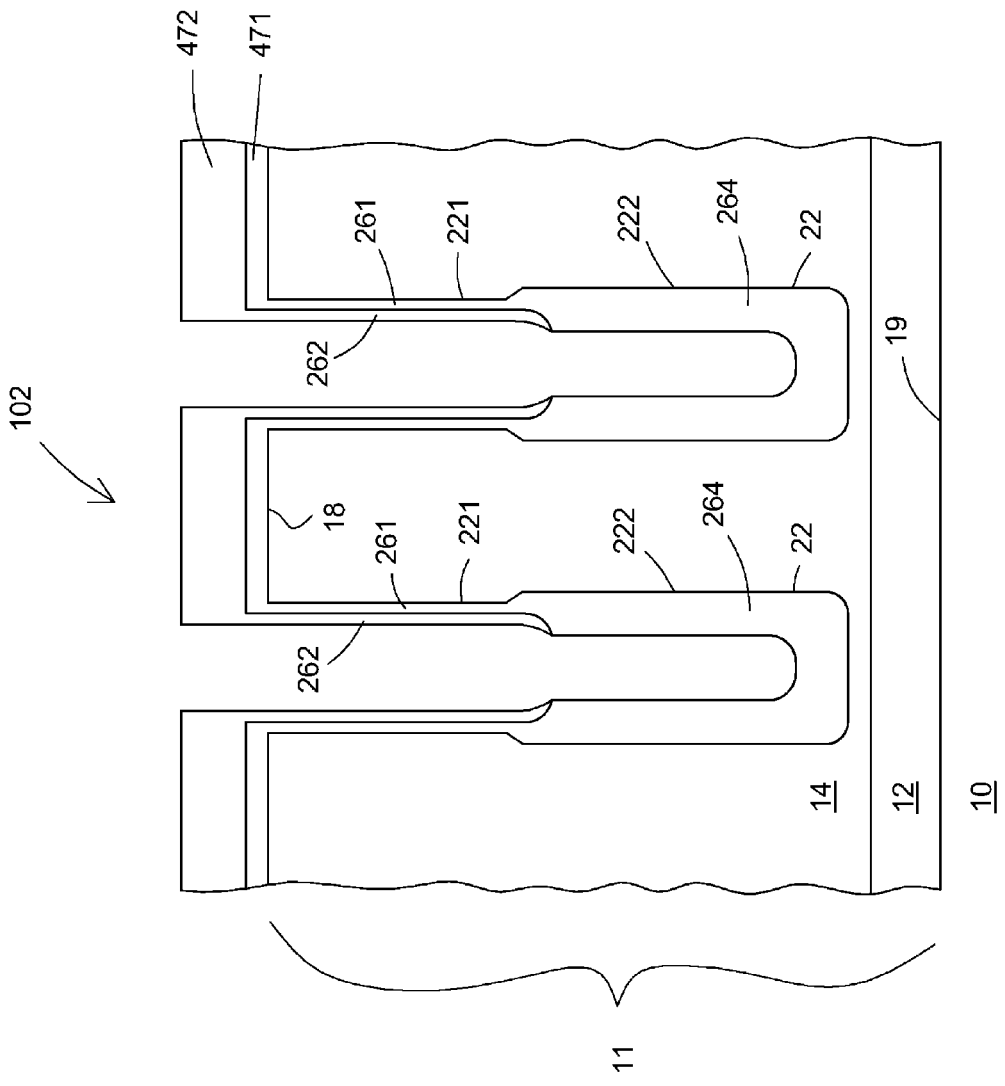

FIG. 5 illustrates a partial cross-sectional view of device 10 after additional processing. In an optional step, a sacrificial layer (not shown) can be formed adjoining surfaces of trenches 222. By way of example, a thermal silicon oxide layer of about 0.04 microns thick can be formed. Next, the sacrificial layer can be removed using, for example, an etch process. Layers 264 of material can then be formed along surfaces of trenches 222. In one embodiment, layers 264 can be one or more dielectric or insulative materials. By way of example, layer 264 can be about a 0.05 micron to about 0.1 micron thermal oxide layer. Portions of semiconductor layer 14 can be consumed during the formation of the thermal oxide. In one embodiment, layer 264 is thicker than layer 261. In one embodiment, layer 264 can be multiple layers of similar or different materials, such as thermal and deposited dielectric or insulative materials.

Figure 6:
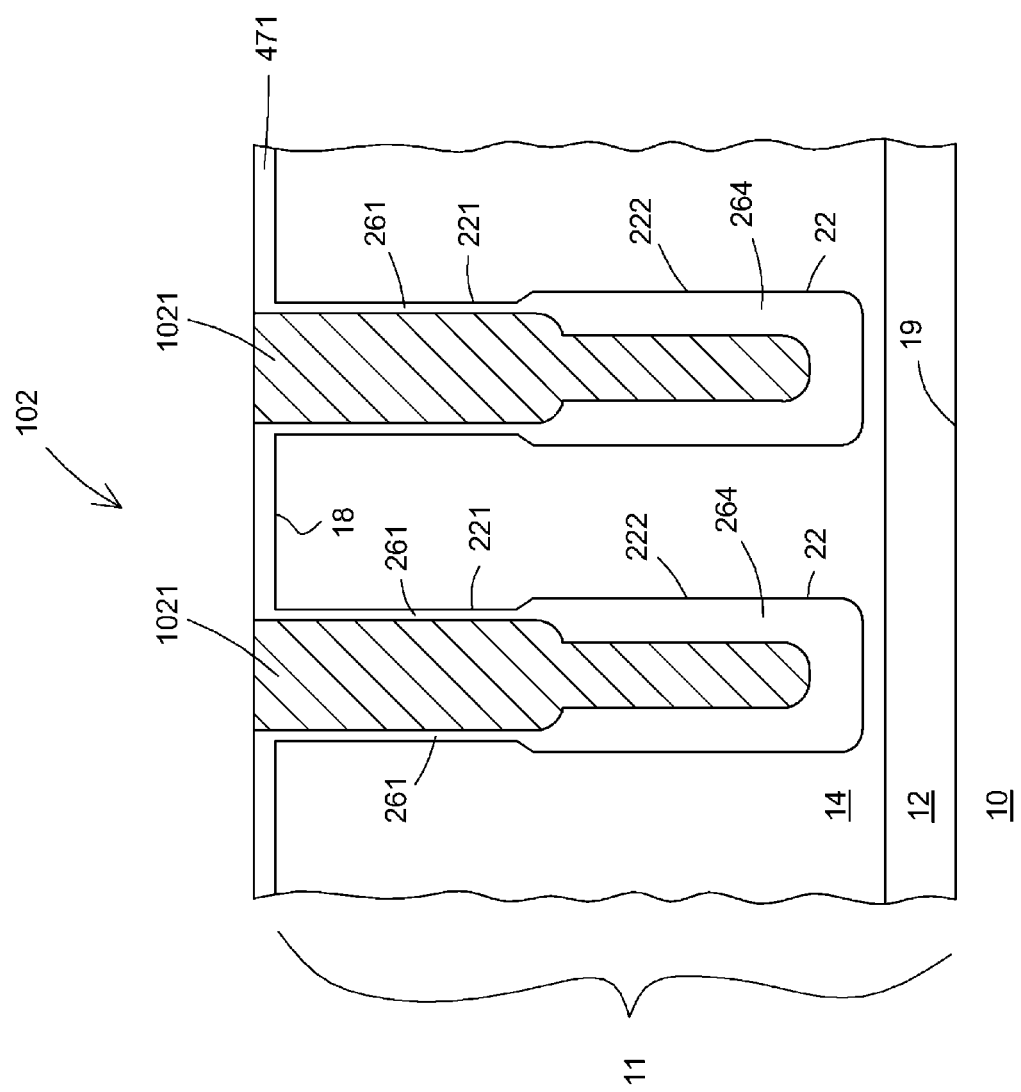

In one embodiment, layers 262 and 472 can then be removed using a wet etch process such as, a phosphoric acid etch process. In one embodiment, a layer of material can be formed overlying major surface 18 and within trench structures 22 along layers 261 and 264. In one embodiment, the layer of material can be a crystalline semiconductor material, a conductive material, or combinations thereof. In one embodiment, the layer of material can be doped polysilicon. In one embodiment, the polysilicon can be doped with an n-type dopant, such as phosphorous or arsenic. In a subsequent step, the layer of material can be planarized to form intermediate structures 1021 within trench structures 22 as generally illustrated in FIG. 6. In one embodiment, chemical mechanical planarization (CMP) techniques can be used for the planarization step. When the layer of material includes crystalline semiconductor material, the layer of material can be heat treated before or after planarization to anneal, activate and/or diffuse any dopant material present in the crystalline semiconductor material.

Figure 7:
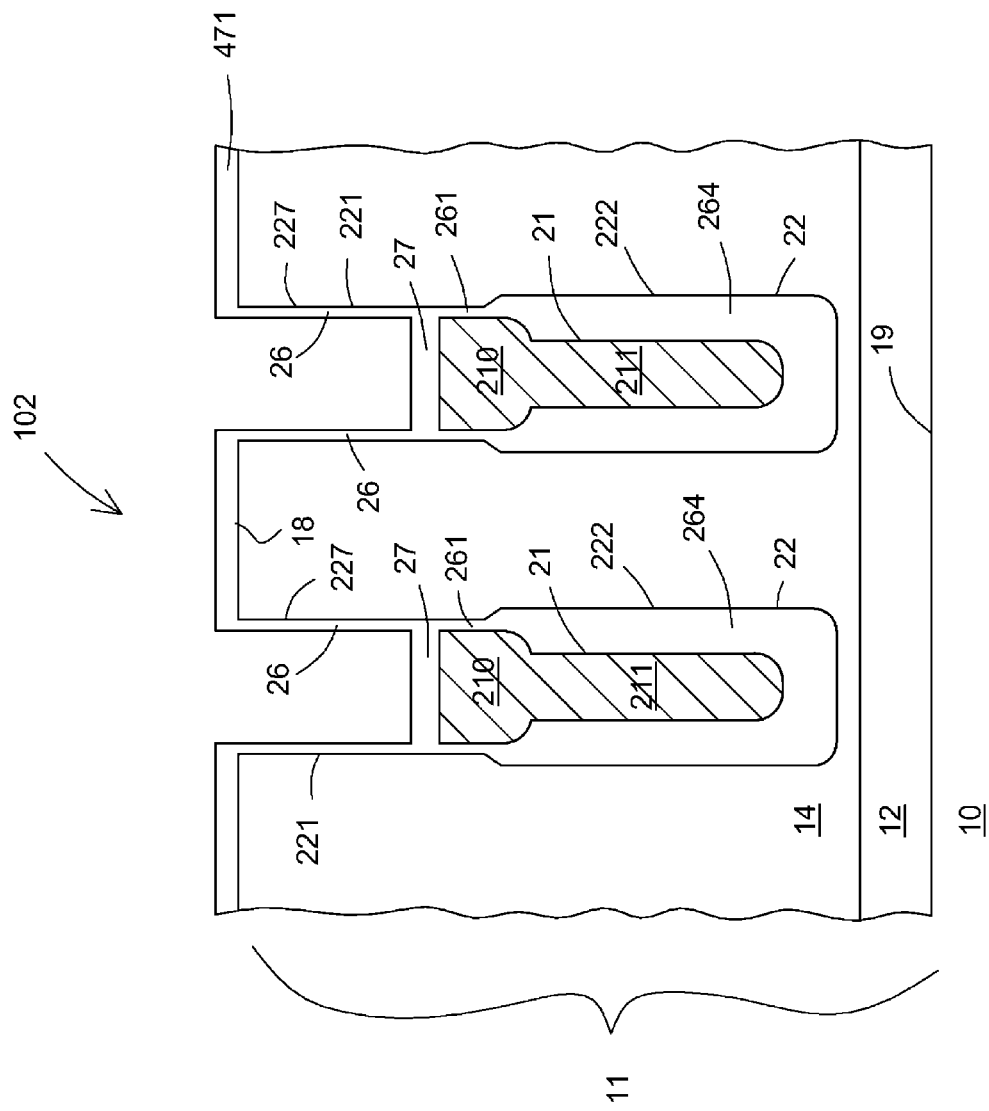

FIG. 7 illustrates a partial cross-sectional view of device 10 after additional processing. For example, intermediate structures 1021 can be further recessed within trench structures 22 to form shield electrodes 21. As an example, a dry etch with a fluorine or chlorine based chemistry can be used for the recess step when shield electrodes 21 include a crystalline semiconductor material. In accordance with the present embodiment, shield electrodes 21 are recessed within trench structures 22 so that upper or wider portions 210 of shield electrodes 21 are above trenches 222 and remain along a portion of layers 261 within trenches 221. Shield electrodes 21 also include lower or narrower portions 211 along layers 264 within trenches 222. Shield electrodes 21 having wider portions 210 adjoining a thinner dielectric (for example, layer 261), and narrower 211 portions adjoining a thicker dielectric layer (for example, layer 264) are different than related devices. Such related devices fully recess the shield electrodes so that the shield electrodes adjoin only the thicker dielectric layer. The multiple-part shield electrode structure of the present embodiment has several advantages, which will be described later.

In one embodiment, in a subsequent step upper or exposed portions of layer 261 and portions of layer 471 can be removed. In another embodiment, upper or exposed portions of layer 261 or portions thereof and portions of layer 471 can be left in place. A dielectric layer can then be formed along upper sidewall portions 227 of trench structures 22. In one embodiment, the dielectric layer can also be formed overlying portions 210 of shield electrode 21. The dielectric layer forms gate layers or gate dielectric layers 26 along upper sidewall surfaces 227 of trenches 22 and inter-electrode dielectric layers 27 overlying portions 210 of shield electrodes 21. Gate layers 26 and inter-electrode dielectric layers 27 can be oxides, nitrides, tantalum pentoxide, titanium dioxide, barium strontium titanate, high k dielectric materials, combinations thereof, or other related or equivalent materials known by one of ordinary skill in the art. In one embodiment, gate layers 26 and inter-electrode dielectric layer 27 can be silicon oxide. In one embodiment, gate layers 26 can have a thickness from about 0.01 microns to about 0.06 microns, and inter-electrode dielectric layers 27 can have a thickness that is greater than that of gate layers 26. In one embodiment, gate layers 26 can have a thickness that is less than that of layers 261.

Figure 8:
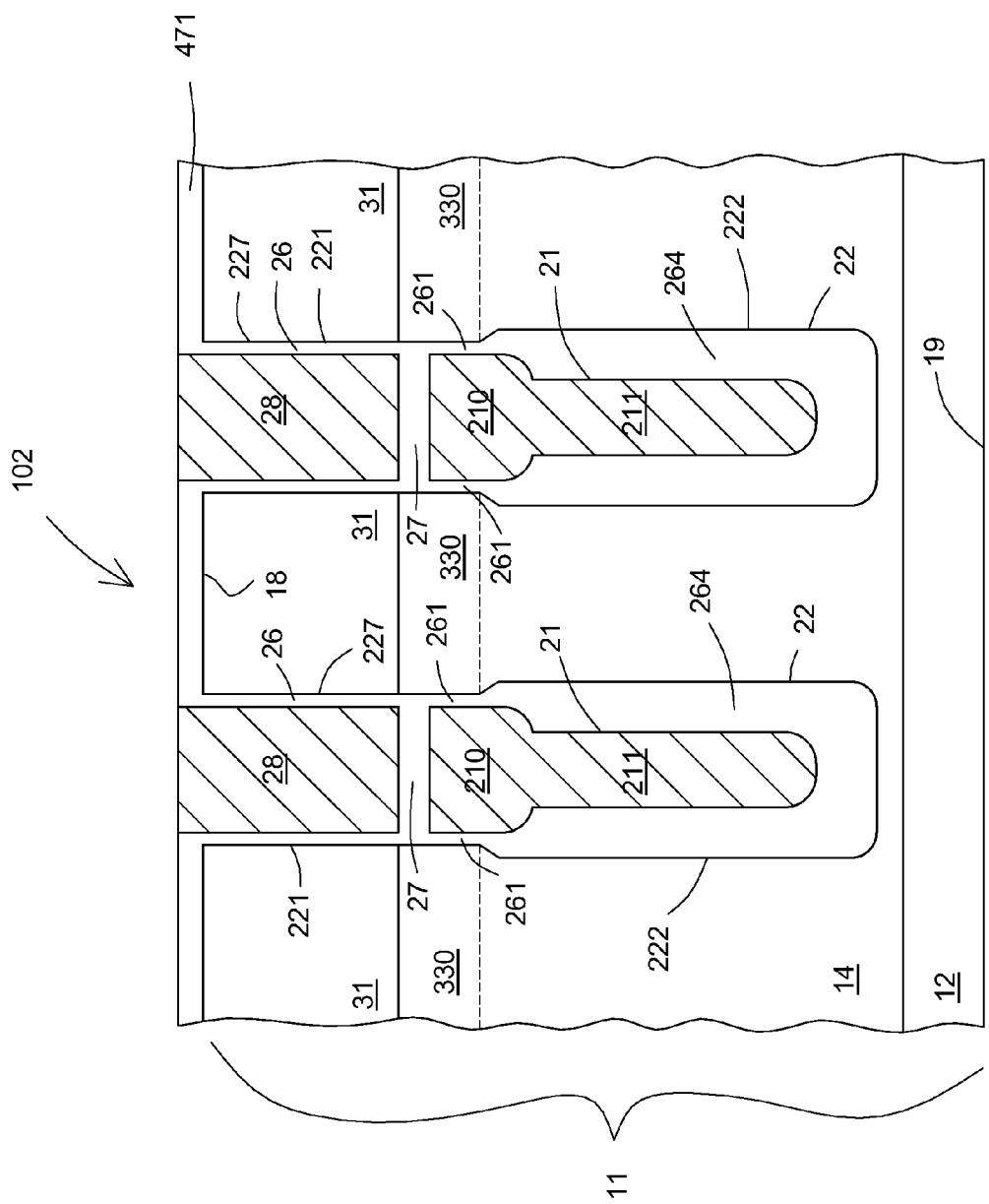

FIG. 8 illustrates a partial cross-sectional view of device 10 after further processing. A layer of material can be formed overlying major surface 18 and within trench structures 22. In one embodiment, the layer of material can be a crystalline semiconductor material, a conductive material, or combinations thereof. In one embodiment, the layer of material can be doped polysilicon. In one embodiment, the polysilicon can be doped with an n-type dopant, such as phosphorous or arsenic. Subsequently, the layer of material can be planarized using dielectric layer 471 as a stop layer. In one embodiment, a CMP process can be used for the planarization step. The planarization step can be used to form gate electrodes 28 within trench structures 22 as illustrated in FIG. 8.

In one embodiment, body, base, or doped regions 31 can be formed extending from major surface 18 adjacent trench structures 22. Body regions 31 can have a conductivity type that is opposite to that of semiconductor layer 14. In one embodiment, body regions 31 can have p-type conductivity and can be formed using, for example, a boron dopant source. Body regions 31 have a dopant concentration suitable for forming inversion layers that operate as conduction channels or channel regions 45 (illustrated, for example, in FIG. 10) of device 10. Body regions 31 can extend from major surface 18 to a depth, for example, from about 0.5 microns to about 2.0 microns. In accordance with the present embodiment, body regions 31 terminate along a portion of trench 221, which leaves wider portion 210 of shield electrodes 21 adjacent semiconductor layer 14 but separated therefrom by layers 261. It is understood that body regions 31 can be formed at an earlier stage of fabrication, for example, before trenches 22 are formed. Body regions 31 can be formed using doping techniques, such as ion implantation and anneal techniques.

In an optional embodiment, doped regions 330 can be formed in semiconductor layer 14 in proximity to upper portions 210 of shield electrodes 21. Doped regions 330 can be used to increase the dopant concentration in semiconductor layer 14 in proximity to lower surfaces of body regions 31 and in proximity to upper portions 210 of shield electrodes 21. Doped regions 330 are configured to help reduce the on-resistance of device 10. In one embodiment, a high energy ion implantation can be used to form doped regions 330. In one embodiment, a phosphorous ion implantation process can be used with an ion implant dose of about $2.0\times10^{12}$ atoms/cm$^2$ and an implant energy of about 1 MeV. In one embodiment, doped regions 330 can be formed using an implant energy in the range of 1 to 3 MeV to implant the dopant in proximity to the mid-point of trench structures 22 and then diffusing a portion of the dopant upward to increase the doping concentration of region 330. In an alternative embodiment, the dopant concentration of semiconductor layer 14 can be increased in a more uniform manner when formed using, for example, epitaxial growth techniques, so that a portion of semiconductor layer 14 in proximity to upper portion 210 of shield electrode 21 can be increased in dopant concentration as semiconductor layer 14 is formed.

In accordance with the present embodiment, shield electrode 21 is configured to place wide portion 210 in proximity to the junction formed between body regions 31 and semiconductor layer 14 (or doped regions 330) and to place narrow portion 211 in proximity to a deeper portion of semiconductor layer 14 or the drift region. In one embodiment, wide portion 210 overlaps that portion of semiconductor layer 14 that is more highly doped (for example, doped regions 330) and another portion of semiconductor layer 14 that has is more lightly doped (for example, that portion semiconductor layer 14 below doped regions 330), as generally illustrated in FIG. 8.

Figure 9:
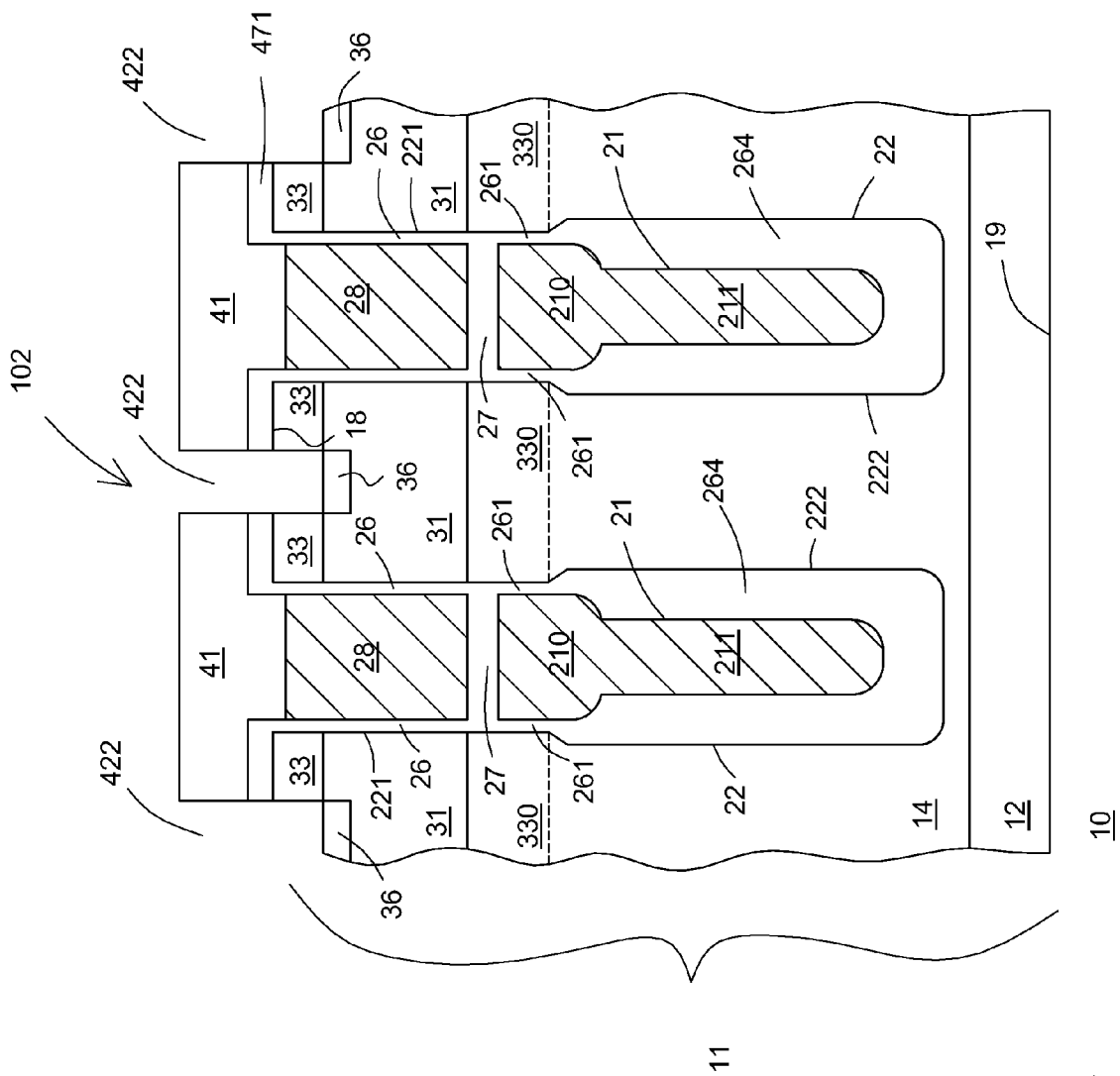

FIG. 9 illustrates a partial cross-sectional view of device 10 after additional processing. In a subsequent step, a masking layer (not shown) can be formed overlying portions of major surface 18. In one embodiment, source regions, current conducting regions, or current carrying regions 33 can be formed within, in, or overlying body regions 31 and can extend from major surface 18 to a depth for example, from about 0.1 microns to about 0.5 microns. In one embodiment, source regions 33 can have n-type conductivity and can be formed using, for example, a phosphorous or arsenic dopant source. In one embodiment, an ion implant doping process can be used to form source regions 33 within body regions 31. The masking layer can then be removed, and the implanted dopant can be annealed.

In one embodiment, gate electrodes 28 can be recessed below major surface 18 as illustrated in FIG. 9. In one embodiment, about 0.15 microns to about 0.25 microns of material can be removed as a result of the recessing step. In one embodiment, a layer or layers 41 can be formed overlying major surface 18. In one embodiment, layers 41 comprise one or more dielectric or insulative layers and can be configured as an inter-layer dielectric (ILD) structure. In one embodiment, layers 41 can be silicon oxides, such as doped or undoped deposited silicon oxides. In one embodiment, layers 41 can include at least one layer of deposited silicon oxide doped with phosphorous or boron and phosphorous and at least one layer of undoped oxide. In one embodiment, layers 41 can have a thickness from about 0.4 microns to about 1.0 microns. In one embodiment, layers 41 can be planarized to provide a more uniform surface topography, which improves manufacturability.

Subsequently, a masking layer (not shown) can be formed overlying device 10, and openings, vias, or contact trenches 422 can be formed for making contact to source regions 33 and body regions 31. In one embodiment, a recess etch can be used to remove portions of source regions 33. The recess etch step can expose portions of body regions 31 below source regions 33. The masking layer can be removed. A p-type body contact, enhancement region, or contact region 36 can then be formed in body regions 31, which can be configured to provide a lower contact resistance to body regions 31. Ion implantation (for example, using boron) and anneal techniques can be used to form contact regions 36.

Figure 10:
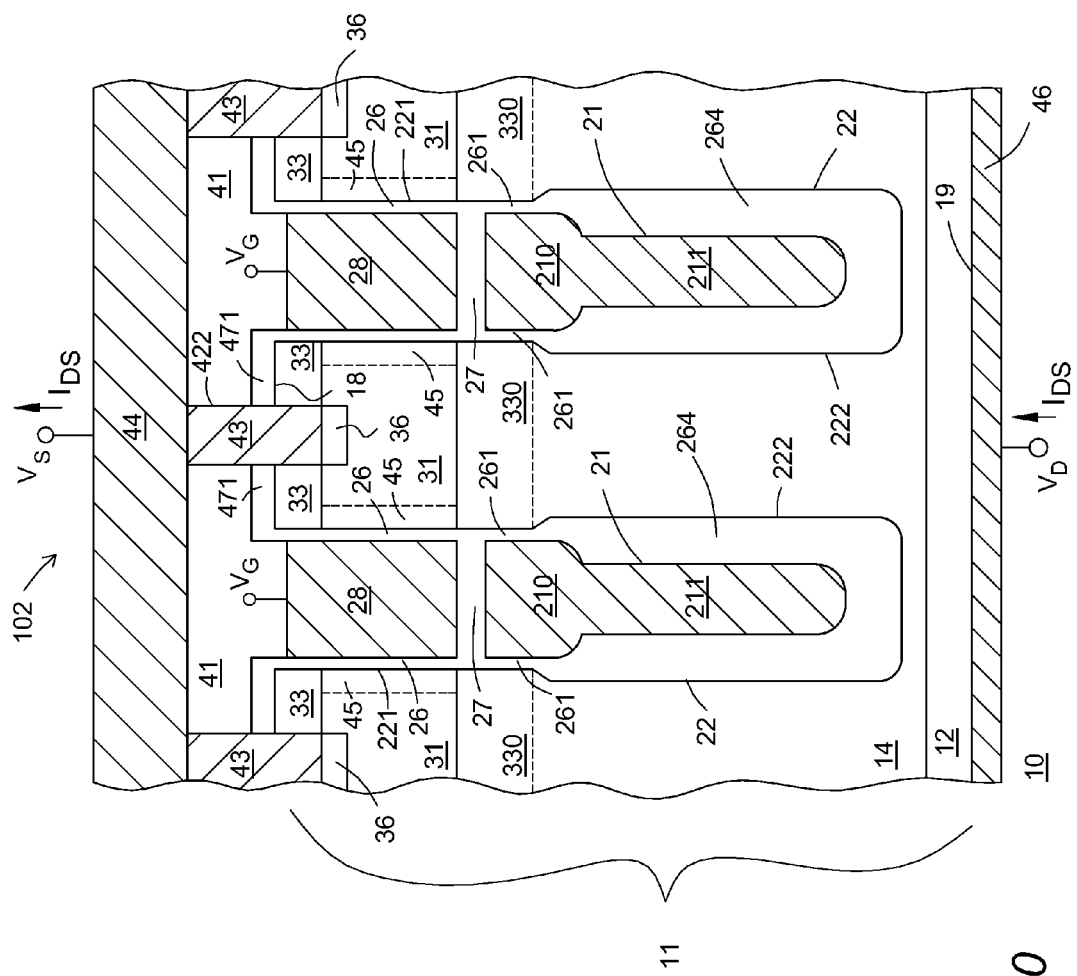

FIG. 10 illustrates a partial cross-sectional view of device 10 after still further processing. In one embodiment, conductive regions 43 can be formed in contact trenches 422 and configured to provide electrical contact to source regions 33, body regions 31 through contact regions 36. It is understood that contact to gate electrodes 28 and shield electrodes 21 can be made in a peripheral portion of device 10 using, for example, trench contact structures. In one embodiment, conductive regions 43 can be conductive plugs or plug structures. In one embodiment, conductive regions 43 can include a conductive barrier structure or liner and a conductive fill material. In one embodiment, the barrier structure can include a metal/metal-nitride configuration, such as titanium/titanium-nitride or other related or equivalent materials as known by one of ordinary skill in the art. In another embodiment, the barrier structure can further include a metal-silicide structure. In one embodiment, the conductive fill material includes tungsten. In one embodiment, conductive regions 43 can be planarized to provide a more uniform surface topography.

A conductive layer 44 can be formed overlying major surface 18, and a conductive layer 46 can be formed overlying major surface 19. Conductive layers 44 and 46 can be configured to provide electrical connection between the individual device components of device 10 and a next level of assembly. In one embodiment, conductive layer 44 can be titanium/titanium-nitride/aluminum-copper or other related or equivalent materials known by one of ordinary skill in the art and is configured as a source electrode or terminal. In one embodiment, conductive layer 46 can be a solderable metal structure such as titanium-nickel-silver, chromium-nickel-gold, or other related or equivalent materials known by one of ordinary skill in the art and is configured as a drain electrode or terminal. In one embodiment, a further passivation layer (not shown) can be formed overlying conductive layer 44. In one embodiment, all or a portion of shield electrodes 21 can be connected (for example, using peripheral contact structures) to conductive layer 44, so that shield electrodes 21 are configured to be at the same potential as source regions 33 when device 10 is in use. In another embodiment, shield electrodes 21 can be configured to be independently biased or coupled in part to gate electrodes 28.

In one embodiment, the operation of device 10 can proceed as follows. Assuming that source electrode (or input terminal) 44 and shield electrodes 21 are operating at a potential $V_S$ of zero volts, gate electrodes 28 would receive a control voltage $V_G$ of 4.5 volts, which is greater than the conduction threshold of device 10, and drain electrode (or output terminal) 46 would operate at a drain potential VD of less than 2.0 volts. The values of $V_G$ and $V_S$ would cause body region 31 to invert adjacent gate electrodes 28 to form channels 45, which would electrically connect source regions 33 to semiconductor layer 14. A device current $I_{DS}$ would flow from drain electrode 46 and would be routed through semiconductor layer 14, channels 45, and source regions 33 to source electrode 44. In one embodiment, $I_{DS}$ is on the order of 10.0 amperes. To switch device 10 to the off state, a control voltage $V_G$ that is less than the conduction threshold of device 10 would be applied to gate electrodes 28 (e.g., $V_G$<1.0 volts). Such a control voltage would remove channels 45 and $I_{DS}$ would no longer flow through device 10. In accordance with the present embodiment, shield electrodes 21, which have wider portions 210 and thinner dielectric layers 261 adjacent the drift region below body region 31, are configured to help deplete the body region 31-semiconductor layer 14 junction faster to move the peak electric field (for example, under avalanche conditions) away from the junction edge, which helps improve UIS performance and maintain $BV_{DSS}$ performance even in the presence of higher doped regions 330. Also, in accordance with the present embodiment, the configuration of shield electrodes 21 helps provide an improved RESURF effect close to the body region 31-semiconductor layer 14 junction to help lower on-resistance while maintaining $BV_{DSS}$. Additionally, the configuration of shield electrodes 21 provides for a higher drain-to-source capacitance, which helps lower ringing issues present in related devices. In addition, thicker dielectric layers 264 are configured to help increase breakdown voltage.

In accordance with the present embodiment, when device 10 was compared to a related device having standard (higher) epitaxial layer doping for a 30 volt device and a standard shield electrode configuration having thick dielectric layer isolation only, device 10 had a slightly higher $BV_{DSS}$ of 32.9 volts compared to 32.5 volts for the related device. Also, with the presence of doped regions 330 (or increased epitaxial layer concentration in proximity to wider portions 210), device 10 had a 7.5% lower on-resistance compared to the related device for the same breakdown voltage and threshold voltage. Additionally, device 10 had a 40% higher drain-to-source capacitance at a $V_{DS}$ of 0 volts compared to the related device and had a 10% higher drain-to-source capacitance at a $V_{DS}$ of 10 volts compared to the related device, which helps reduce ringing effects.

Figure 11:
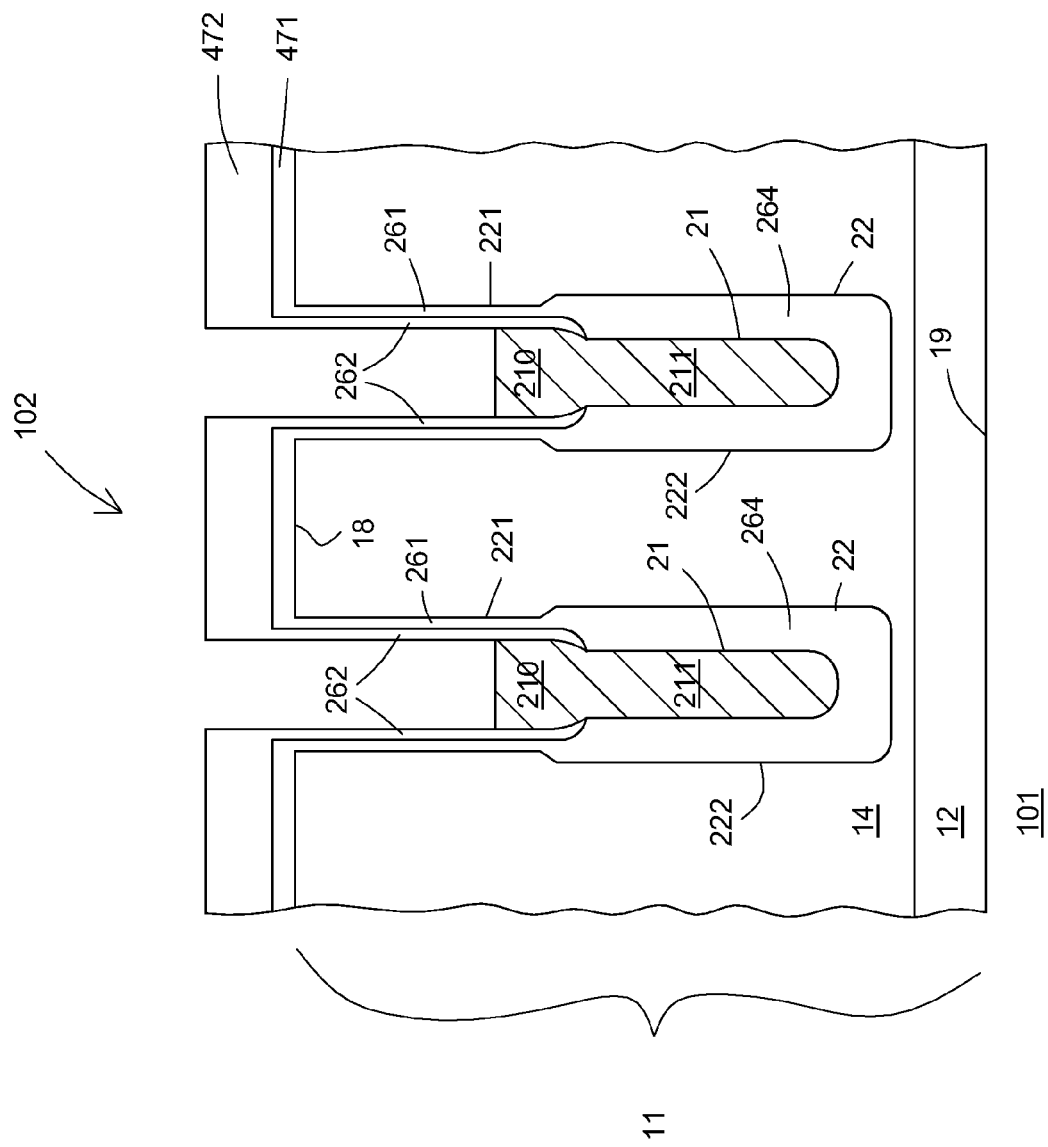
FIGS. 11-14 illustrate partial cross-sectional views of a semiconductor device at various stages of fabrication in accordance with a second embodiment of the present invention.

FIG. 11 illustrates a partial cross-sectional view of a semiconductor device 101 or cell 101 at an intermediate stage of fabrication in accordance with a second embodiment. By way of example, device 101 can be processed similarly to device 10 shown in FIGS. 1-5. However, in device 101 dielectric layer 262 is left in place while shield electrode 21 is formed instead of first removing it. In one embodiment, a layer of material can be formed overlying major surface 18 and within trench structures 22 along layers 262 and 264. In one embodiment, the layer of material can be a crystalline semiconductor material, a conductive material, or combinations thereof. In one embodiment, the layer of material can be doped polysilicon. In one embodiment, the polysilicon can be doped with an n-type dopant, such as phosphorous or arsenic. In a subsequent step, the layer of material can be planarized and recessed to form shield electrodes 21 having wider portions 210 and narrow portions 211 as illustrated in FIG. 11.

Figure 12:
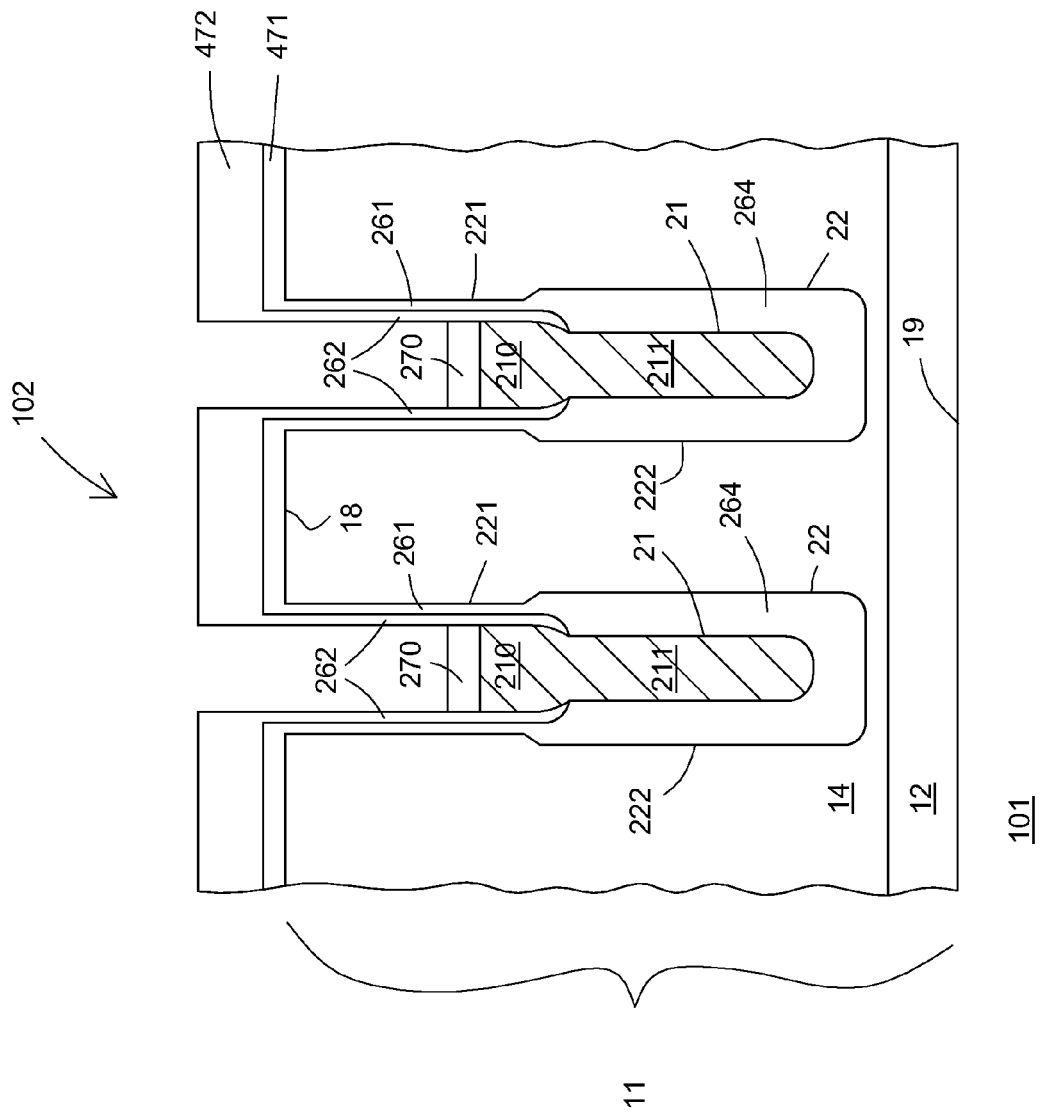
Figure 13:
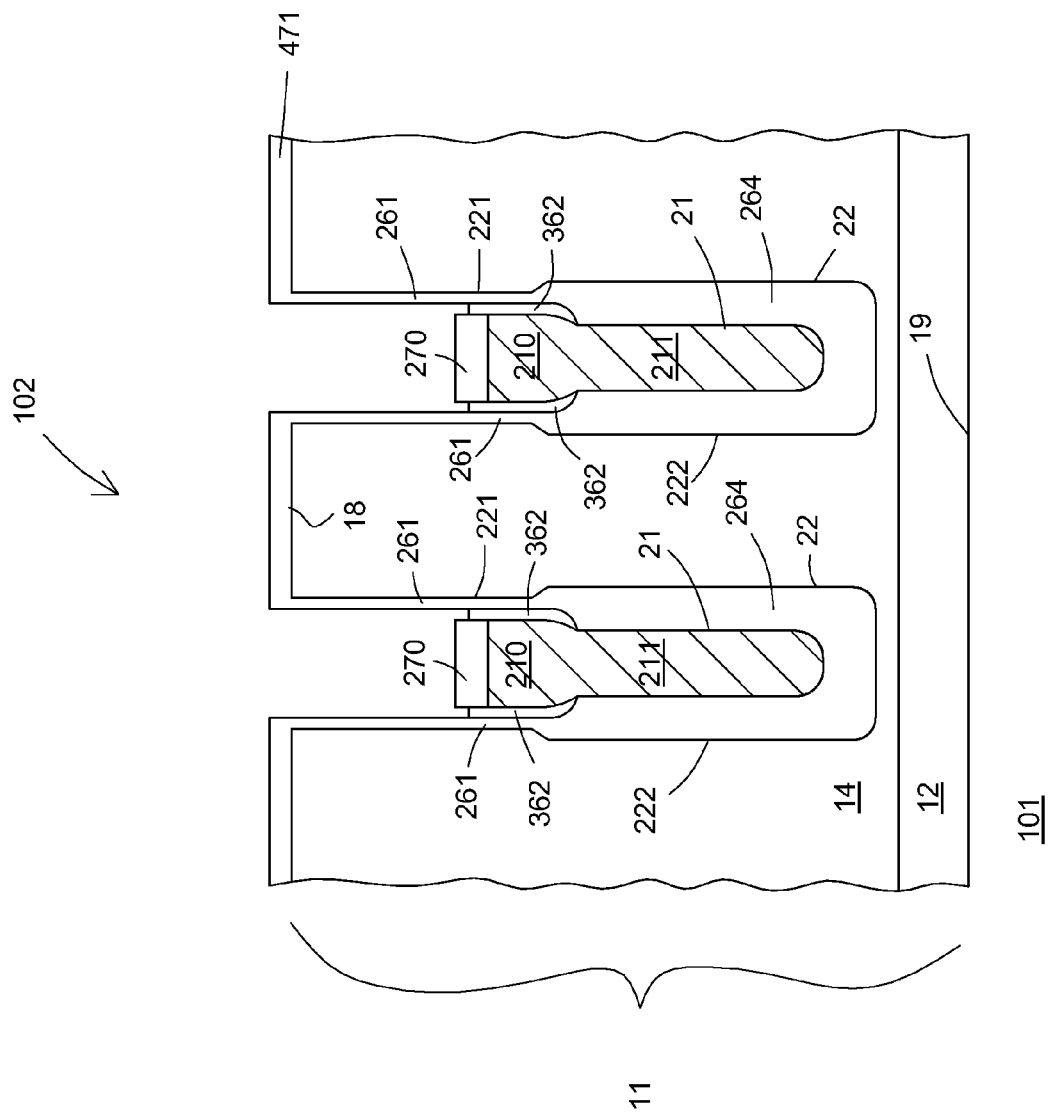

FIG. 12 illustrates a partial cross-sectional view of device 101 after additional processing. In one embodiment, layers 270 can be formed overlying shield electrode 21. In one embodiment, layers 270 can comprise a dielectric or insulative material or materials and are configured, for example, as inter-electrode dielectric layers. In one embodiment, layers 270 can comprise a silicon oxide formed using thermal oxidation techniques. In one embodiment, layers 270 can have a thickness from about 0.1 microns to about 0.3 microns. Layers 262 and 472 can be removed as described previously in conjunction with FIG. 5. In accordance with the present embodiment, portions 362 of layers 262 remain adjacent upper portions 210 of shield electrode 21 as generally illustrated in FIG. 13. In one embodiment, portions 362 are configured as nitride liners adjacent upper portions 210 of shield electrodes 21.

Figure 14:
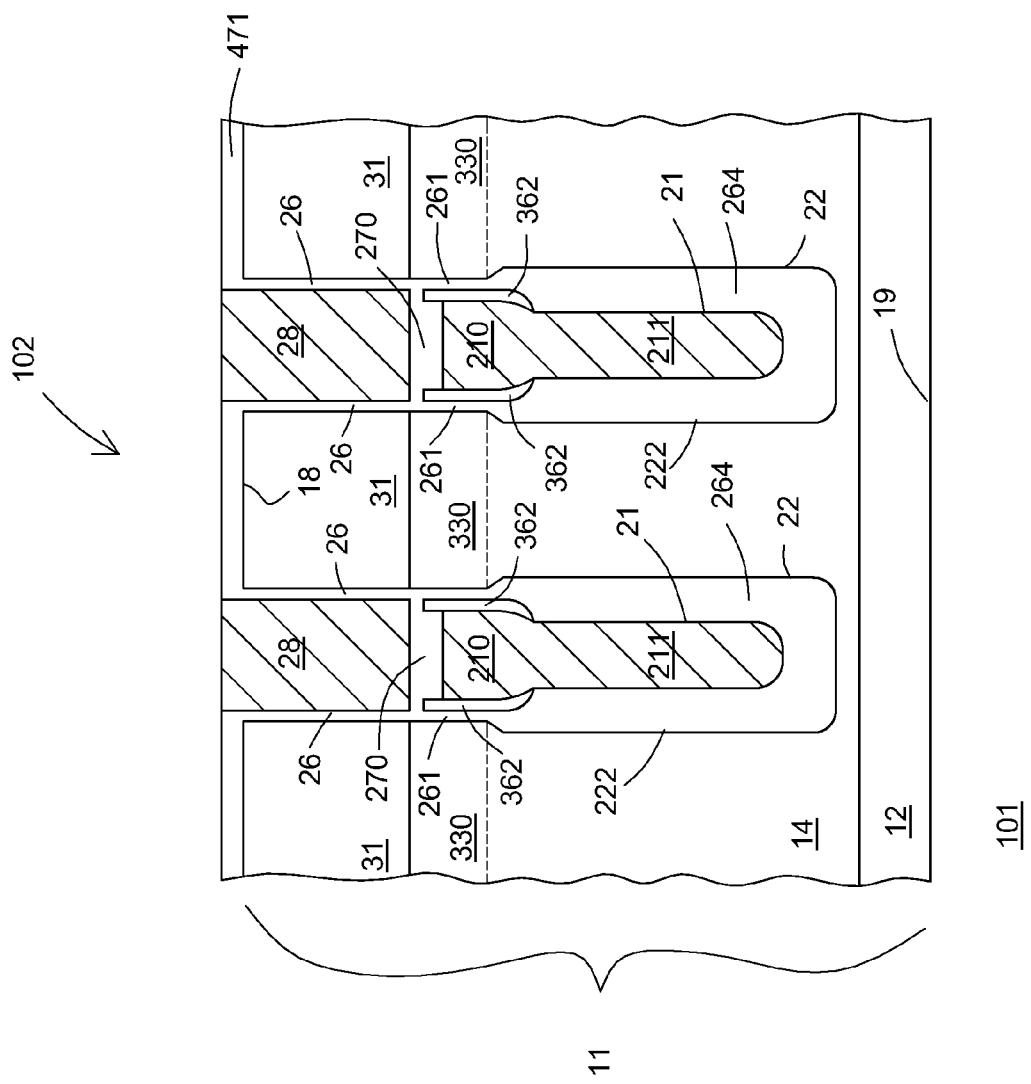
Figure 15:
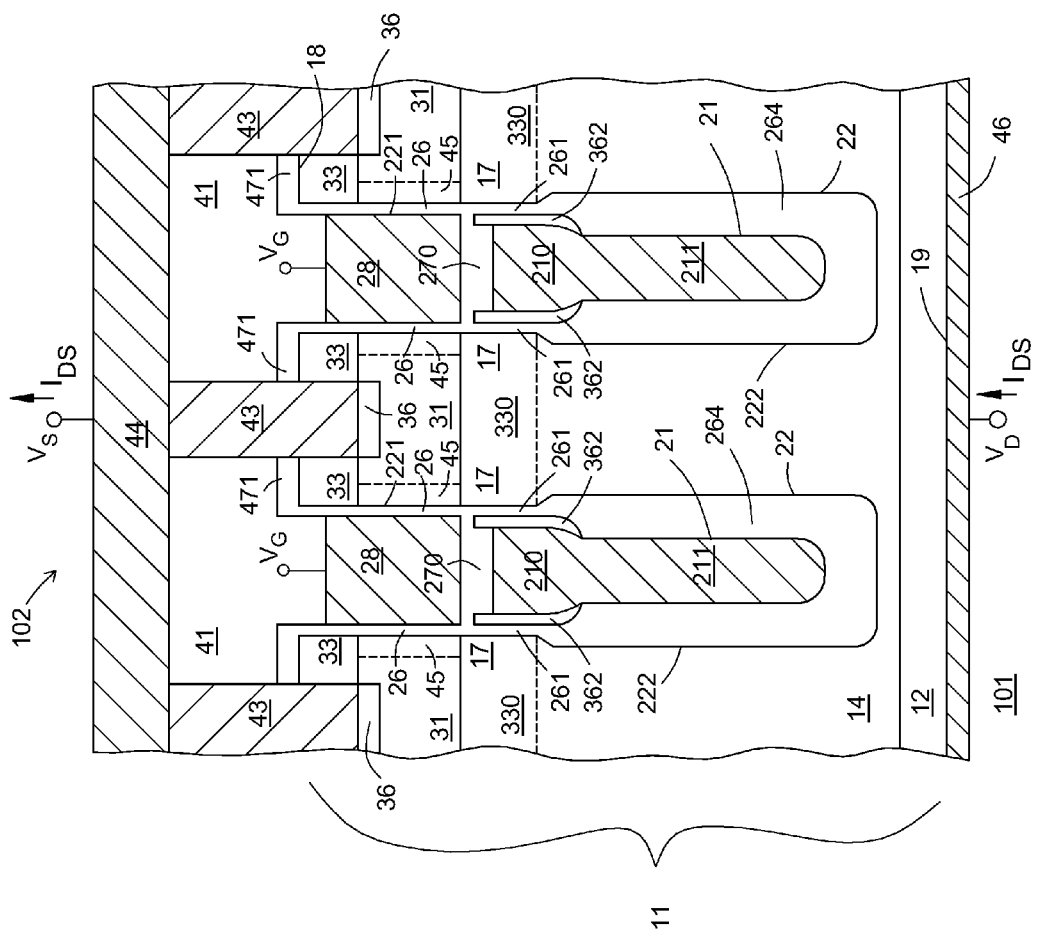
FIG. 15 illustrates a partial cross-sectional view of a portion of semiconductor device in accordance with another embodiment of the present invention.

FIG. 14 illustrates a partial cross-sectional view of device 101 after further processing. In one embodiment, upper or exposed portions of layer 261 and/or portions of layer 471 can be removed. In another embodiment, upper or exposed portions of layer 261 or portions thereof and/or portions of layer 471 can be left in place. In one embodiment, a gate dielectric clean process can be used followed by a gate dielectric regrowth process to form gate layers 26 as described in conjunction with FIG. 8. In the present embodiment, this step can fill-in gaps between inter-electrode dielectric layer 270 and gate layers 26 as illustrated in FIG. 14. Body regions 31, doped regions 330, and gate electrodes 28 can be formed as described in conjunction with FIG. 8. Device 101 can be further processed as described in conjunction with FIGS. 9 and 10 to provide the structure illustrated in FIG. 15.

Device 101 has similar advantages as described in conjunction with device 10. Also, in device 101, portions 362 are configured or placed to induce or propagate stress such as tensile stress within drift regions 17 of device 101. Stated another way, when device 101 comprises an n-channel device, structures 362 can be under compressive stress to generate tensile stress in proximity to drift regions 17. When device 101 comprises a p-channel device, structures 362 can be under tensile stress in order to generate a compressive stress in proximity to drift regions 17. In accordance with the present embodiment, structures 362 increase carrier mobility in the regions under stress, which, in turn, further reduces on-resistance for device 101. The stress can propagate to the channel region to lower the channel resistance as well.

Figure 16:
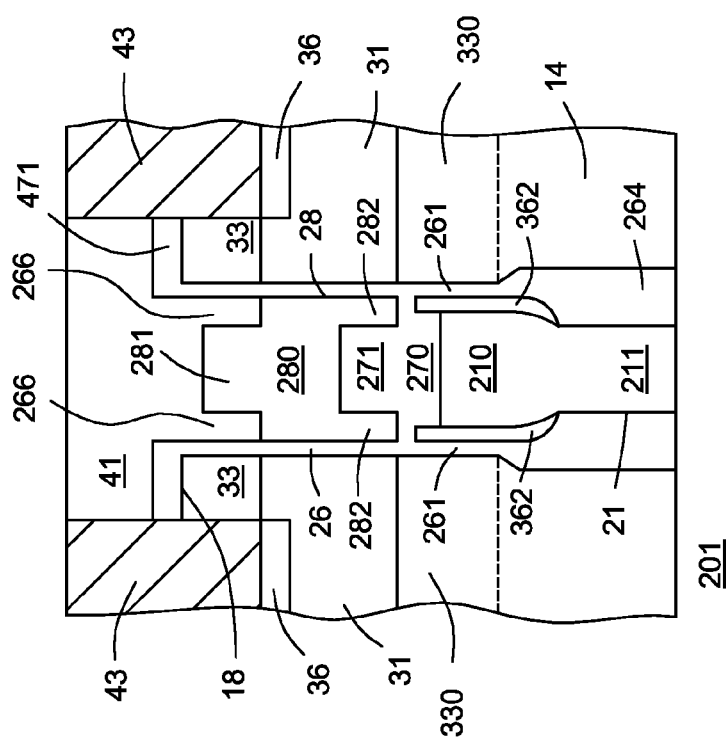
FIG. 16 illustrates a partial cross-sectional view of a portion of a semiconductor device in accordance with a further embodiment of the present invention.

FIG. 16 illustrates a partial cross-sectional view of a semiconductor device 201 in accordance with another embodiment. Device 201 is similar to device 101 with additional features included with gate electrode 28. In one embodiment, gate electrode 28 can include a central wide portion 280 and an upper narrow portion 281. With upper narrow portion 281, gate dielectric layer 26 further includes thick dielectric portions 266 adjacent upper narrow portion 281. Dielectric portions 266 can be configured to increase the distance between gate electrode 28 and source regions 33 to help reduce gate-to-source capacitance. In one embodiment, gate electrode 28 can include thin, fin, or fin-like portions 282 that overlie a portion of shield electrode 21 and are adjacent body regions 31. Thin portions 282 can be separated by dielectric layer 271 formed overlying inter-electrode dielectric layer 270 as illustrated in FIG. 16. This configuration increases the isolation between gate electrode 28 and shield electrode 21, which helps reduce to gate-to-source capacitance when shield electrode 21 is shorted to source electrode. It is understood that gate electrode 28 can be configured to include either one or both of the configurations described herein.

Figure 17:
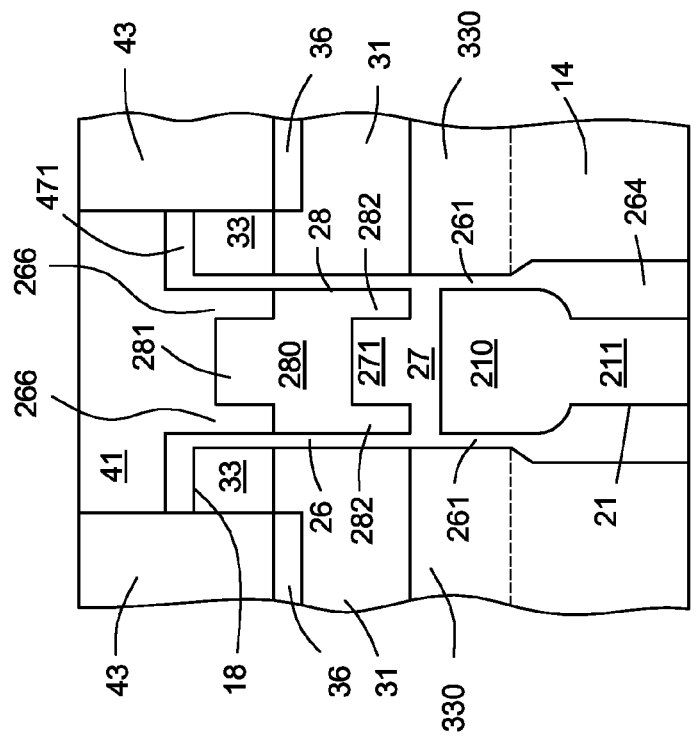
FIG. 17 illustrates a partial cross-sectional view of a portion of a semiconductor device in accordance with an additional embodiment of the present invention.

FIG. 17 illustrates a partial cross-sectional view of a semiconductor device 301 in accordance with a further embodiment. Device 301 is similar to device 201, except device 301 is formed absent layers 362.

From all of the foregoing, one skilled in the art can determine that, according to one embodiment, an insulated gate semiconductor device comprises a region of semiconductor material (for example, element 11) including a semiconductor layer (for example, element 14) of a first conductivity type and having a major surface (for example, element 18). A body region (for example, element 31) of a second conductivity type is formed in the semiconductor layer extending from the major surface. A trench structure (for example, element 22) formed in the semiconductor layer extending from the major surface adjacent the body region, and wherein the trench structure comprises an insulated gate electrode (for example, elements 28, 26) and a shield electrode (for example, elements 21, 210, 211) having a first portion (for example, element 210) and a second portion (for example, element 211), wherein the first portion is wider than the second portion, and wherein the first portion is between the gate electrode and the second portion, and wherein the first portion is separated at least in part from the semiconductor layer by a first dielectric layer (for example, element 261), and wherein the second portion is separated from the semiconductor layer by a second dielectric layer (for example, element 264) that is thicker than the first dielectric layer.

Those skilled in the art will also appreciate that, according to another embodiment, in the structure described in paragraph [0038] the semiconductor layer can have a first dopant concentration in proximity to the first portion and a second dopant concentration in proximity to the second portion, wherein the first dopant concentration is greater than the second dopant concentration.

Those skilled in the art will also appreciate that, according to another embodiment, the structure described in paragraph [0038] can further include a dielectric liner (for example, element 362) formed between the first dielectric layer and the first portion.

Those skilled in the art will also appreciate that, according to still another embodiment, a method for making an insulated gate semiconductor device having a shield electrode structure comprises the steps of providing a region of semiconductor material (for example, element 11) having a major surface (for example, element 18). The method includes forming a first trench (for example, element 221) extending from the major surface into the region of semiconductor material. The method includes forming a dielectric structure (for example, elements 261, 262) along surfaces of the first trench. The method includes forming a second trench (for example, element 222) extending from the first trench into the region of semiconductor material. The method includes forming a first dielectric layer (for example, elements 264) along surfaces of the second trench, wherein the first dielectric layer is thicker than the dielectric structure. The method includes forming a shield electrode (for example, elements 21, 210, 211) within the second trench along the first dielectric layer and within a portion of the first trench along a portion of the dielectric structure, wherein the shield electrode has a wide portion (for example, element 210) adjacent the dielectric structure and a narrow portion (for example, element 211) adjacent the first dielectric layer. The method includes forming an inter-electrode dielectric layer (for example, elements 27, 270) overlying the wide portion. The method includes forming a gate electrode (for example, element 28) overlying the inter-electrode dielectric layer. The method includes forming a body region (for example, element 21) within the region of semiconductor material, wherein the body region and the first trench are adjacent.

Those skilled in the art will also appreciate that, according to another embodiment, the method described in paragraph [0041] can further comprise forming a doped region (for example, element 330) within the region of semiconductor material in proximity to the wide portion, wherein the body region is between the major surface and the doped region, and wherein the doped region has a higher dopant concentration than that of the region of semiconductor material.

Those skilled in the art will also appreciate that, according to another embodiment, in the method described in paragraph [0041] the step of forming the dielectric structure can include forming a second dielectric layer (for example, element 261) along surfaces of the first trench, forming a third dielectric layer (for example, element 262) overlying the second dielectric layer, and removing portions of the first and second dielectric layers along a lower surface of the first trench.

Those skilled in the art will also appreciate that, according to another embodiment, the method described in paragraph [0043] can further include removing a portion of the third dielectric layer (for example, element 262) after forming the shield electrode, wherein another portion (for example, element 362) of the third dielectric layer remains between the wide portion and the second dielectric layer.

Those skilled in the art will also appreciate that, according to yet another embodiment, a method for forming a semiconductor device comprises providing a region of semiconductor material (for example, element 11) having a semiconductor layer (for example, element 14) of a first conductivity type and having a major surface (for example, element 18). The method includes forming a trench structure (for example, element 22, 221, 222). The method includes forming a shield electrode (for example, elements 21, 210, 211) within the trench structure having a first portion (for example, element 210) and a second portion (for example, element 222), wherein the first portion is wider than the second portion, and wherein the first portion is separated at least in part from the semiconductor layer by a first dielectric layer (for example, element 261), and wherein the second portion is separated from the semiconductor layer by a second dielectric layer (for example, element 222) that is thicker than the first dielectric layer. The method includes forming an insulated gate electrode (for example, elements 26, 28) in the trench structure. The method includes forming a body region (for example, element 31) of a second conductivity type in the semiconductor layer extending from the major surface, wherein the body region and the trench structure are adjacent.

Those skilled in the art will also appreciate that, according to a still further embodiment, the method described in paragraph [0045] can further include forming a doped region (for example, element 330) of the first conductivity type in the semiconductor layer in proximity to the first portion, wherein the body region is between the major surface and the doped region, and wherein the doped region has a higher dopant concentration than that of the semiconductor layer.

Those skilled in the art will also appreciate that, according to another embodiment, the method described in paragraph [0045] can further include forming a dielectric liner between the first dielectric layer and the first portion.

In view of all the above, it is evident that a novel method and structure are disclosed. Included, among other features, is a shield electrode structure that includes a wide portion and a narrow portion. The wide portion is placed in proximity to drain-end of the channel and is separated therefrom by a thin dielectric layer. The narrow portion is placed further down in the drift region and is separated therefrom with a thicker dielectric layer. Also, the dopant concentration of the drain region near the wide portion can be increased. The structure is configured to, among other things, reduce on-resistance, reduce ringing effects, reduce drain-to-source capacitance, maintain $BV_{DSS}$, and/or improve UIS performance. Additional features include dielectric liners placed between the thin dielectric layers and the wide portion of the shield electrode. The dielectric liners are configured to induce stress in the drain end of the channel region and the channel region to increase mobility and reduce on-resistance. Other features include a gate electrode structure having wide, narrow, and/or fin portions, which are configured to reduce gate-to-source capacitance and improve isolation between the gate electrode and the shield electrode.

While the subject matter of the invention is described with specific preferred embodiments and example embodiments, the foregoing drawings and descriptions thereof depict only typical embodiments of the subject matter and are not therefore to be considered limiting of its scope. It is evident that many alternatives and variations will be apparent to those skilled in the art. For example, the subject matter has been described for a particular n-channel MOSFET structure, although the method and structure is directly applicable to other MOS transistors, as wells as bipolar, BiCMOS, metal semiconductor FETs (MESFETs), HFETs, thyristors bi-directional transistors, and other transistor structures.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments, as would be understood by those skilled in the art.

What is claimed is:

1. A method for making an insulated gate semiconductor device having a shield electrode structure comprising:
    providing a region of semiconductor material having a major surface;
    forming a first trench extending from the major surface into the region of semiconductor material;
    forming a dielectric structure along surfaces of the first trench, the dielectric structure comprising a first dielectric layer along surfaces of the first trench and a second dielectric layer overlying the first dielectric layer;
    removing portions of the first and second dielectric layers along a lower surface of the first trench;
    forming a second trench extending from the first trench into the region of semiconductor material;
    forming a third dielectric layer along surfaces of the second trench, wherein the third dielectric layer is thicker than the dielectric structure;
    forming a shield electrode within the second trench along the third dielectric layer and within a portion of the first trench along a portion of the dielectric structure, wherein the shield electrode has a wide portion adjacent the dielectric structure and a narrow portion adjacent the third dielectric layer;
    removing a portion of the second dielectric layer after forming the shield electrode, wherein another portion of the second dielectric layer remains between the wide portion and the first dielectric layer;

forming an inter-electrode dielectric layer overlying the wide portion;

forming a gate electrode overlying the inter-electrode dielectric layer; and forming a body region within the region of semiconductor material, wherein the body region and the first trench are adjacent.

2. The method of claim 1 further comprising forming a doped region within the region of semiconductor material in proximity to the wide portion but not in proximity to at least a portion of the narrow portion, wherein the body region is between the major surface and the doped region, and wherein the doped region has a higher dopant concentration than that of the region of semiconductor material.

3. The method of claim 1, wherein forming the second dielectric layer includes forming a nitride layer.

4. A method for forming a semiconductor device comprising:

providing a region of semiconductor material having a semiconductor layer of a first conductivity type and having a major surface;

forming a trench structure;

forming a shield electrode within the trench structure having a first portion and a second portion, wherein the first portion is wider than the second portion, and wherein the first portion is separated at least in part from the semiconductor layer by a first dielectric layer, and wherein the second portion is separated from the semiconductor layer by a second dielectric layer that is thicker than the first dielectric layer;

forming a doped region of the first conductivity type in the semiconductor layer, wherein the doped region is in proximity to the first portion of the shield electrode but not in proximity to at least a portion of the second portion of the shield electrode, and wherein the doped region has a higher dopant concentration than that of the semiconductor layer;

forming an insulated gate electrode in the trench structure; and forming a body region of a second conductivity type in the semiconductor layer extending from the major surface, wherein the body region and the trench structure are adjacent, wherein the body region is between the major surface and the doped region.

5. The method of claim 4, wherein forming the doped region in proximity to the first portion but not adjoining any part of the second portion.

6. The method of claim 4 further comprising forming a dielectric liner between the first dielectric layer and the first portion.

7. The method of claim 6, wherein forming the dielectric liner comprises forming a nitride liner.

8. A method for forming a semiconductor device comprising:

providing a region of semiconductor material having a semiconductor layer of a first conductivity type and having a major surface;

forming a trench structure extending from the major surface at least into the semiconductor layer;

forming a shield electrode within the trench structure having a first portion and a second portion, wherein the first portion is wider than the second portion, and wherein the first portion is separated at least in part from the semiconductor layer by a first dielectric layer, and wherein the second portion is separated from the semiconductor layer by a second dielectric layer that is thicker than the first dielectric layer;

forming a dielectric liner between the first dielectric layer and the first portion of the shield electrode;

forming an insulated gate electrode in the trench structure;

forming a body region of a second conductivity type in the semiconductor layer extending from the major surface, wherein the body region and the trench structure are adjacent; and forming a source region of the first conductivity type in spaced relationship with the body region.

9. The method of claim 8 further comprising forming a doped region of the first conductivity type in the semiconductor layer in proximity to the first portion of the shield electrode, wherein the body region is between the major surface and the doped region, and wherein the doped region has a higher dopant concentration than that of the semiconductor layer.

10. The method of claim 9, wherein forming the doped region includes forming the doped region in proximity to the first portion of the shield electrode but not in proximity to at least a portion of the second portion of the shield electrode.

11. The method of claim 8, wherein forming the dielectric liner comprises forming a nitride liner.

* * * * *